(12) United States Patent
Lasser

(10) Patent No.: US 6,678,785 B2
(45) Date of Patent: Jan. 13, 2004

(54) FLASH MANAGEMENT SYSTEM USING ONLY SEQUENTIAL WRITE

(75) Inventor: Menahem Lasser, Kohav-Yair (IL)

(73) Assignee: M-Systems Flash Disk Pioneers Ltd., Kfar Saba (IL)

( * ) Notice: Subject to any disclaimer, the term of this patent is extended or adjusted under 35 U.S.C. 154(b) by 195 days.

(21) Appl. No.: 09/964,606

(22) Filed: Sep. 28, 2001

(65) Prior Publication Data

US 2003/0065876 A1 Apr. 3, 2003

(51) Int. Cl.[7] .............................................. G06F 12/00
(52) U.S. Cl. .................................. 711/103; 365/185.33
(58) Field of Search ......................... 711/103, 202–203, 711/205–206; 707/100; 714/805; 365/185.29, 185.23

(56) References Cited

U.S. PATENT DOCUMENTS

| | | | |
|---|---|---|---|
| 5,404,485 A | 4/1995 | Ban | 711/202 |
| 5,566,194 A * | 10/1996 | Wells et al. | 714/805 |
| 5,937,425 A | 8/1999 | Ban | 711/103 |
| 5,978,808 A * | 11/1999 | Wells et al. | 707/100 |
| 6,477,632 B1 * | 11/2002 | Kikuchi | 711/203 |

OTHER PUBLICATIONS http://www.ssfdc.or.jp/english/business/index.htm.

* cited by examiner

*Primary Examiner*—Nasser Moazzami
(74) *Attorney, Agent, or Firm*—Mark M. Friedman

(57) ABSTRACT

A system and method for managing flash devices that are limited to performing only sequential write operations. After a write request has been received, a physical portion of the flash device is located for writing the data, according to the location of a previously written physical portion which was the last such portion to be written in the same block, such that the physical portion is physically at a higher address within the block than the previously written physical portion. In other words, the write operation is performed in a place that does not violate the sequential write limitation, rather than being performed at a randomly chosen location. This portion is preferably a location in a block, such as a page for example, such that if a page is available for writing in the same block, the data is written to that page. Again, this page is preferably at a higher address than any previously written page in that block.

53 Claims, 3 Drawing Sheets

FLASH MANAGEMENT SYSTEM USING ONLY SEQUENTIAL WRITE

FIELD OF THE INVENTION

The present invention relates to a system and method for more efficient data management and storage on flash devices and, in particular, to a system and method in which the storage and retrieval of information on flash devices is performed through sequential write operations on sequential physical portions of the memory.

BACKGROUND OF THE INVENTION

Flash devices include electrically erasable and programmable read-only memories (EEPROMs) made of flash-type, floating-gate transistors and are non-volatile memories similar in functionality and performance to EPROM memories, with an additional functionality that allows an in-circuit, programmable, operation to erase portions of the memory. Flash devices have the advantage of being relatively inexpensive and requiring relatively little power as compared to traditional magnetic storage disks. However, in a flash device, it is not practical to rewrite a previously written area of the memory without a preceding erase of the area. This limitation of flash devices causes them to be incompatible With typical existing operating system programs, since data cannot be written to an area of memory within the flash device in which data has previously been written, unless the area is first erased.

Software products have been proposed in the background art to allow a flash device to be managed by existing computer operating programs without modification of the operating system program. However, these background art programs all have deficiencies. For example, one program operates the flash memory as a "write once read many" device. This background art software product cannot recycle previously written memory locations. When all locations are eventually written the memory cannot be further used without specific user intervention. To overcome these deficiencies of the background art, a Flash File System (FFS) was disclosed in U.S. Pat. No. 5,404,485, which is owned in common with the present application and which is hereby incorporated by reference as if fully set forth herein. FFS provided a system of data storage and manipulation on flash devices which allowed these devices to emulate magnetic disks. As noted above, the relatively inexpensive cost and low power consumption of flash devices makes them a favorable choice for data storage, particularly for laptop, portable computers. FFS enhances the ability of flash devices to act as substitutes for magnetic disk storage. Indeed, FFS as disclosed in U.S. Pat. No. 5,404,485 has proven to be so useful that the data layout specification was adopted by the PCMCIA (Personal Computer Memory Card International Association) and JEIDA (Japan Electronic Industry Development Association) committees as a standard called Flash Translation Layer (FTL).

FFS essentially describes a virtual mapping system for flash EEPROM devices. The virtual map is a table which relates the physical address of a read/write page within the flash device to the virtual address of that page. Since each of these pages is relatively small, 512 bytes, the size of the virtual map itself is quite large. FFS also includes a method of storing and maintaining the bulk of the virtual map on a flash EEPROM device, minimizing the amount of other memory required for storage of the virtual map.

As noted above, FFS has proven particularly successful for transforming flash devices into emulators of magnetic disk storage, so much so that it has been adopted as an industry standard. However, FFS cannot fulfill all of the requirements of the newer flash device technologies. In particular, FFS is not as successful with the NAND and AND flash technologies. Therefore, U.S. Pat. No. 5,937,425, which is owned in common with the present application and which is hereby incorporated by reference as if fully set forth herein, describes an additional implementation of the flash management system for these technologies. However, both of these implementations are useful mainly for specific types of technologies for flash memories.

Typical flash management systems, including the previously described systems, rely on being able to write pages in a unit in a random order, such that the first page to be written into a previously empty block is not necessarily, physically, the first page in the block but rather a page in the middle or even at the end. This sequence of data insertion can continue in any random order, as the flash devices are assumed to allow any page writing order of the pages within a block. The above management systems operate quite well with these types of flash devices.

An exception to this type of mechanism for writing data can be found in flash management systems which avoid such random insertion of data. These systems operate by allocating a new block, and copying the already written pages from the existing block into the new block, in parallel with writing the new page into that same block for every write operation. While such methods can avoid the need for a random order of page write operations by always writing the new block sequentially, they are highly inefficient when the page write requests themselves arrive in a random order, as a new block must be allocated and previous data must be copied on almost every write operation. Thus, the most efficient currently available file management systems such as FFS rely upon writing new data according to a random page order.

However, as the silicon geometries of flash devices continue to shrink, their characteristics and behavior are increasingly influenced by the smaller geometries. In particular, random page orders for writing data become increasingly less reliable for the operation of these physically more compact flash devices. Recently, a major flash manufacturer, Toshiba Inc. (Japan) announced that its next generation of NAND flash devices, using technology of the 0.16 micron process, are to require sequential page write operations within a block, rather than the insertion of data according to a random page order. As these devices are expected to be widely used in the market, there is therefore an urgent need to develop an efficient flash management system which performs only sequential write operations into the flash memory.

SUMMARY OF THE INVENTION

The background art does not teach or suggest a mechanism for the efficient management of flash devices limited to sequential page writing operations. In addition, the background art does not teach or suggest such a mechanism which does not require data to be written to a newly allocated block and for previously written pages to be moved to that new block as part of the same operation.

The present invention overcomes these deficiencies of the background art by providing a memory organization method which supports flash devices limited to sequential page write operations, such that data is written to the flash device, without requiring previously written data to be moved, and without violating the sequential write limitation.

According to the present invention, there is provided a system comprising: (a) a flash memory system comprising at least one flash device, said flash device featuring memory comprising a plurality of blocks, each block comprising a plurality of pages; (b) a flash management system for managing page write requests regardless of an order in which said page write requests are received; and (c) a module for converting said order of receiving said page write requests into a writing order, such that data in said page write requests are written as physically sequential pages within each block, regardless of said order of receiving said page write requests.

Hereinafter, the term "physical unit" is defined as a unit on the physical media or hardware of the memory which is the smallest portion of the memory which can be erased or an integral multiple thereof It is a portion of the memory which is contiguous, fixed in size and erasable.

The term "page" is hereinafter defined as the smallest chunk of data to be written in one operation. The terms "block" and "unit" are defined as the same size as the physical unit, with a block containing one or more pages.

Hereinafter, the term "virtual unit" is defined as the same size as the physical unit.

Hereinafter, the term "virtual map" refers to a table which relates a virtual block or page to at least one corresponding physical block or page.

Hereinafter, the term "writing data" describes the act of storing data on the flash memory. The term "reading data" describes the act of retrieving data from the flash memory. Hereinafter, the term "unwritten" indicates some portion of the memory, such as a physical block, which is capable of having data written to it. Thus, the term "unwritten" includes, but is not limited to, a portion of the memory which has just been erased.

In a computer or other electronic device having a flash memory organized according to the present invention, the operating system of that device interacts with the virtual units and virtual pages for reading and writing data. The virtual media, which includes the virtual units and pages, thus acts as an interface for the operating system to interact with the flash memory device. For example, the operating system issues a write command to write data to a virtual page. The virtual unit containing the virtual page is then located. The virtual map then locates a corresponding physical page within a physical unit of the memory, where the data are actually stored. Although the operating system issues read and write commands as though the virtual units and virtual pages are the actual hardware of the flash memory, in reality the actual hardware is incorporated in the physical units and physical pages of the flash memory. Thus, the operating system is only aware of the virtual units and pages, and does not directly interact with the hardware itself The advantage of such an interface is that the inherent disadvantages of the flash memory, such as the requirement for performing an erase operation before further writing can occur, are overcome by the interactions of the operating system with the virtual addresses rather than the physical addresses.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
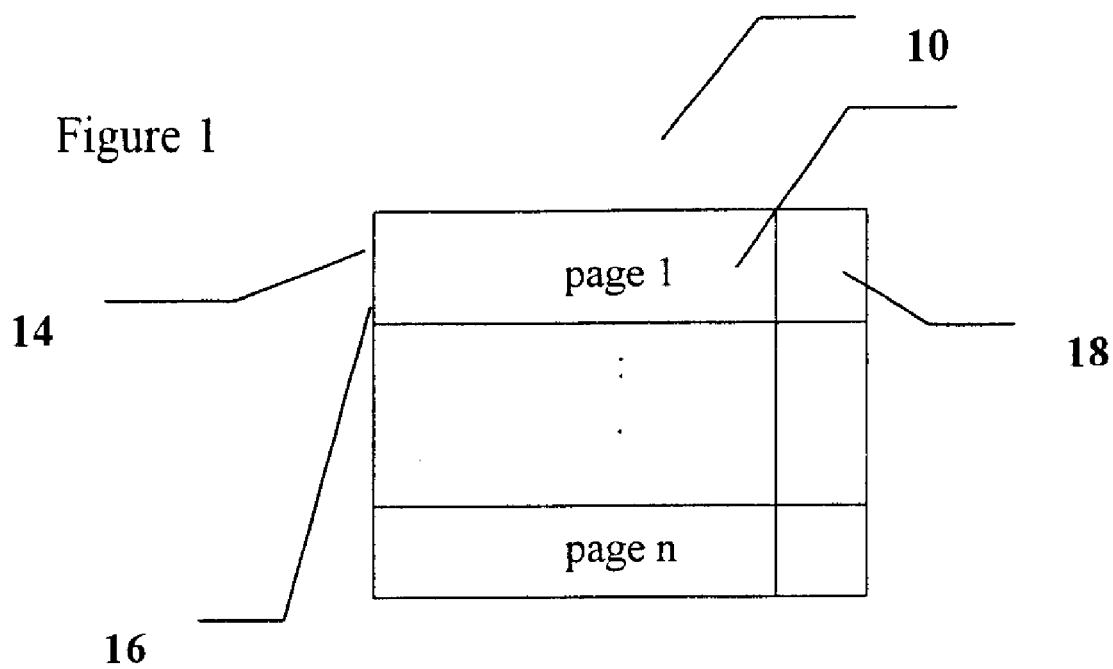
FIG. 1 is a schematic diagram of a physical flash memory device according to the present invention.

The present invention is of a system and method for efficiently managing flash devices limited to performing only sequential write operations to a flash device unit. After a write request has been received, a physical portion of the flash device is located for writing the data, according to the location of a previously written physical portion which was the last such portion to be written in the same block, such that the physical portion is physically at a higher address within the block than the previously written physical portion. In other words, the write operation is performed in a place that does not violate the sequential write limitation, rather than being performed at a randomly chosen location. This portion is preferably a location in a block, such as a page for example, such that if a page is available for writing in the same block, the data is written to that page. Again, this page is preferably at a higher address than any previously written page in that block. Therefore, although optionally and more preferably "sequentially" refers to physically contiguous addresses, this term preferably refers to an address which at least is higher than any previously written address in the same block.

Optionally and preferably, if a plurality of write requests is received, the data is not written randomly, even if the requests are received in a random order. Instead, the data is preferably written according to a sequential order of pages within each physical unit.

More preferably, the flash device features a plurality of virtual addresses mapped to physical addresses. Each physical address corresponds to a physical page in a physical block, and each virtual address corresponds to a virtual page in a virtual block. The write request preferably contains a request to write data to a virtual address, which is then converted to a physical address. Optionally and most preferably, the virtual addresses are mapped to the physical addresses by mapping each virtual block into one or more physical blocks. Alternatively and most preferably the virtual addresses are mapped to the physical addresses by mapping each virtual page to one or more physical pages.

Regardless of the unit of mapping, however, the present invention is operative to write data sequentially, without being forced to copy previously written data each time in order to maintain the sequential order of the physical locations of written data.

The present invention may also optionally be implemented as a system, featuring at least one, but optionally a plurality of, flash devices, and a flash management system for organizing the flash devices for writing according to the previously described method of the present invention.

While this invention will be described in the context of a flash device, those skilled in the art will understand that its teachings are also applicable to data storage devices with the same write, read, and unit erase characteristics as flash devices.

The principles and operation of a system and method according to the present invention may be better understood with reference to the drawings and the accompanying description.

Referring now to the drawings, FIG. 1 schematically illustrates a background art physical page-mode flash memory device according to a technology such as NAND, for example. The term "physical device" is hereinafter defined as the actual hardware itself which contains the physical media for the flash memory device. Such physical media is typically composed of flash EEPROM units, although any suitable non-volatile, programmable memory device could be substituted. The term "programmable" is hereinafter defined as alterable, such as by having data written to the memory device, for example.

A flash memory physical device 10 is shown, with at least one physical block 12. Physical block 12 is the smallest segment of physical device 10 which can be erased, or an integral multiple thereof. Physical block 12 includes an integral number of pages, individually designated as pages 1 to n, where n is an integer, and collectively designated as page 14. Page 14 is composed of a contiguous, fixed-length group of physical byte addresses and is a feature of the hardware. Specifically, the size of page 14 is a characteristic of physical device 10. User data can be stored in a primary data area 16 of page 14. Each page 14 also has a control data area 18. Control data area 18 is typically addressable by a separate algorithm from the main portion of page 14 and is not included in calculations of the size of page 14. As further described below, control data area 18 is convenient for the storage of information related to the flash filing system itself.

Figure 2:
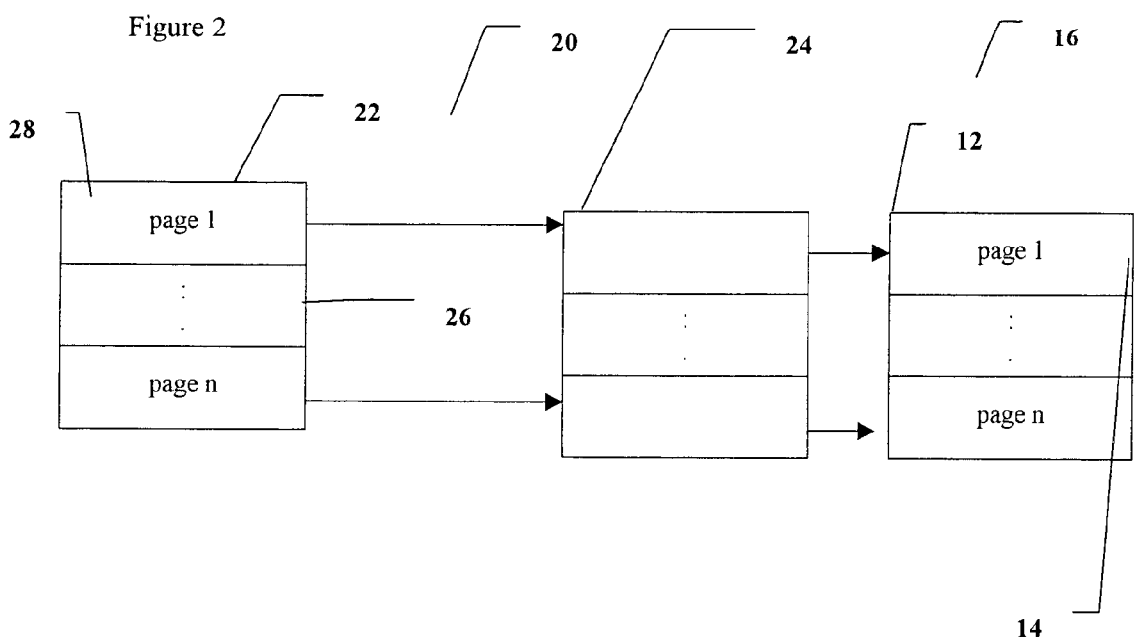
FIG. 2 is a diagram of a basic system of organizing the flash memory device according to the present invention.

FIG. 2 illustrates a system for organizing a basic flash memory device. A system 20 controls both a virtual media 22 and physical device 10, and relates virtual media 22 to physical device 10 through a virtual map 24. Virtual media 22 includes a plurality of virtual blocks 26. Each virtual block 26 has a plurality of virtual pages 28. Each virtual block 26 is designated by a virtual address. The virtual address includes a virtual block number, designating a particular virtual block 26. Each virtual page 28 is designated by a virtual page offset. Similarly, each physical block 12 has a physical address. The physical address includes a physical block number, designating a particular physical block 12. Each physical block 12 has a plurality of physical pages 14. Each physical page 14 has a physical page offset.

Virtual map 24 maps virtual block 26 to at least one physical block 12. Alternatively or additionally, virtual map 24 maps virtual page 28 to at least one physical page 14. As described in greater detail below, preferably either virtual blocks 26 are mapped to physical blocks 12, or alternatively, virtual pages 28 are mapped to physical pages 14. These two alternative mapping systems are similar, in that either pages or blocks may form the basis of mapping according to the present invention; but mapping with a basic unit of pages or blocks does not change the operation of the method of the present invention for writing data sequentially.

It should be noted that one virtual block 26 can be mapped to more than one physical block 12, and/or one virtual page 28 can be mapped to more than one physical page 14. Thus, the correspondence between virtual block 26 and physical block 12 can be either one-to-one or one-to-many.

System 20 operates as follows. The operating system of an electronic device which contains a flash memory device (not shown) sends a command, such as a read command or a write command, to a particular virtual page 28 within a particular virtual block 26. Virtual map 24, or more preferably a software module for performing these functions which is contained within virtual map 24, then locates the corresponding physical page 14 within a physical block 12. However, according to the present invention, physical page 14 is the next physically sequential page 14 in physical block 12, such that sequential write operations are performed on physically sequential pages 14 within physical block 12. Virtual pages 28 do not need to be sequential within virtual blocks 26, and may in fact be received for writing operations according to a random order.

Figure 3:
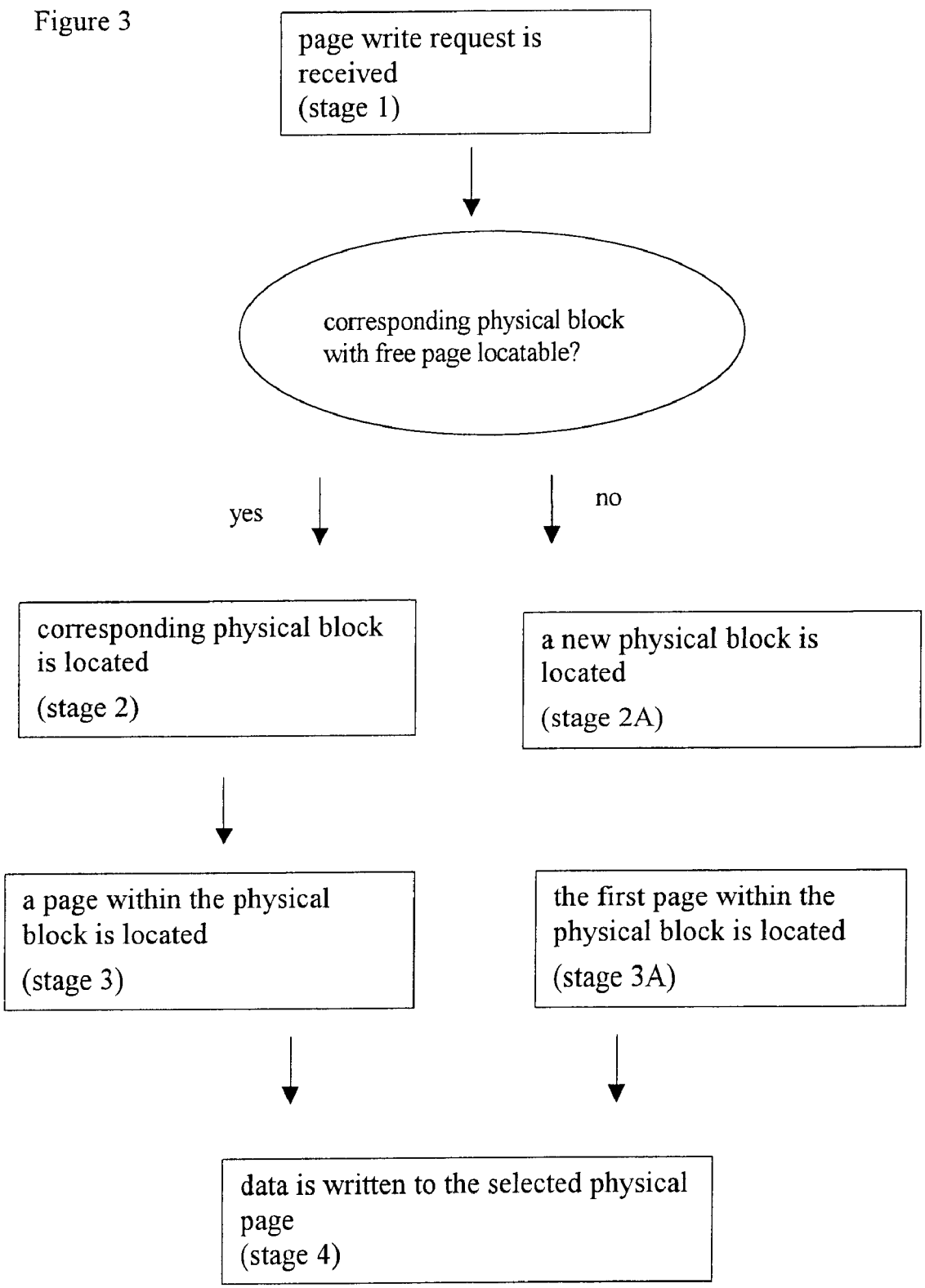
FIG. 3 is a flowchart of an exemplary method according to the present invention.

The flowchart of FIG. 3 shows an exemplary method according to the present invention. A virtual map stores the mapping of each virtual block to at least one physical block. The flash device (or other type of memory) is assumed to have the feature that data can only be written to an unwritten portion of the memory, such that a portion of the memory which has been written must be erased before different data can be written to the memory.

Assuming that the basic unit of mapping is a block, such that each virtual block is mapped into one or more physical blocks, then in stage 1, the write request includes a request to write data to a particular virtual page. If a corresponding physical block with at least one free page can be located (is locatable), then in stage 2, the corresponding physical block is located. This stage is preferably performed by first finding the virtual block containing the virtual page, and then using the virtual map to locate a physical block into which the data may be written. Next, in stage 3, a page within the physical block is located, preferably according to the location of the physical page which was most recently written with data in that physical block. Therefore, the physical page which is chosen should preferably have a higher address than the most recently written physical page within that physical block. One possible approach, but not the only one, is to have the chosen page be optionally and more preferably physically contiguous to the most recently written physical page within that physical block. Alternatively, the chosen page may not be physically contiguous, but would still have a higher address. In stage 4, the data is written to the selected physical page.

Even if a plurality of write requests are received, in a random order within a virtual block, preferably only sequential page write operations are performed within the physical blocks. Therefore, for each page write request in its turn, data is preferably written to a next free physical page of the physical block into which the write request for that page was mapped in stage 2, in which the next free physical page at least has higher address, but optionally and more preferably is physically contiguous to the previously written page.

Optionally, each physically written page is written with its corresponding virtual page number put into the control data area of the physical page. Such a virtual page number may then optionally be used to identify the most recently written data corresponding to a requested virtual page for reading data from the flash memory. More preferably, if a plurality of physical pages in the same physical block have an identical virtual page number associated with them, the physical page to be read is the physical page containing the most recently written data. Such a situation, in which a plurality of physical pages has an identical virtual page number, may happen for example when the operating system requests writing to the same virtual page several times in sequence. Each request would then result in writing to another physical page, with all such physical pages having the same virtual page number associated with them. When attempting to later read this page, in order to obtain the most recent data stored into the virtual page, the desired physical page from the group of pages having the requested virtual page number is the physical page which has the highest address within the physical block. This physical page must be the page most recently written and therefore containing the most recent data according to the method of the present invention.

Returning now to FIG. 3, if a write request is received for which a corresponding physical block which has an available physical page for writing cannot be located, then the alternative branch of the flowchart is followed, shown as stages 2A and 3A. Preferably, a new physical block is allocated for the virtual block (as shown in stage 2A) and the first page of this physical block is selected (as shown in stage 3A) so that data from the write request is written into this first physical page of the new physical block in stage 4.

Optionally and preferably, "compacting" or otherwise reducing the amount of storage space in the flash device which is being used may be desired, and more preferably is performed on at least an occasional basis. For that purpose preferably at least the latest copy of at least one physical page may be copied into a new physical location to free at least one physical unit. The new physical location can be in a newly allocated physical block, or in a previously mapped physical block. It should be noted that in any case, such a copying operation can be distinguished from background art methods which require copying previously written data for each write operation, in that copying for the method of the present invention is optional and is not necessarily performed for each write operation.

For example, optionally and preferably, this copying operation is performed when more free space is required and the amount of free space is below some preset number. For example, the operation could optionally be performed when the number of free blocks is below some preset number.

As another example, optionally and preferably, this copying operation is performed when the size of the group of physical blocks corresponding to a virtual block would otherwise become larger than a preset number. Also optionally, the preset number is one, such that the group of physical blocks always contains only one block, such that the virtual blocks map to the physical blocks according to one-to-one mapping.

A similar mapping method may optionally be performed with flash management systems which use pages rather than blocks as their basic mapping items, such that virtual pages are mapped to physical pages without defining a mapping of virtual blocks into physical blocks, and is considered to be within the scope of the present invention. In such a situation, similar methods to those described above also apply, except that the role of the group of physical blocks corresponding to the applicable virtual unit is taken by some subset of the flash physical address space (which may be the whole address space or any portion of it, whether contiguous or not), regardless of the virtual address to be written.

It will be appreciated that the above descriptions are intended only to serve as examples, and that many other embodiments are possible within the spirit and the scope of the present invention.

What is claimed is:

1. A system comprising:
   (a) a flash memory system comprising at least one flash device, said flash device featuring memory comprising a plurality of blocks, each block comprising a plurality of pages;
   (b) a flash management system for managing page write requests from outside of said flash memory system and said flash management system regardless of an order in which said page write requests are received; and
   (c) a module for converting said order of receiving said page write requests into a writing order, such that data in said page write requests alone with associated control data are written as physically sequential pages within each block, regardless of said order of receiving said page write requests, and such that, in fulfilling each said page write request, copying previously written pages to a new location is optional.

2. The system of claim 1, wherein said flash management system contains a plurality of virtual addresses and wherein said flash device contains a plurality of physical addresses, such that said flash management system maps said virtual addresses to said physical addresses by mapping each virtual block into one or more physical blocks.

3. The system of claim 2, wherein each page write request is to a virtual address and wherein said flash management system maps virtual address to a physical address, such that within each block, pages are written to a next higher physical address for each subsequent page write operation.

4. The system of claim 3, wherein said control data that is written to each physically written page includes a corresponding virtual page number within a corresponding virtual block.

5. The system of claim 4, wherein said virtual page number identifies most recently written data corresponding to a requested virtual page when reading data from the flash memory system.

6. The system of claim 5, wherein if a plurality of physical pages are associated with an identical virtual page number, said physical page corresponding to said requested virtual page is said physical page to which data has been most recently written.

7. The system of claim 3, wherein a physical block corresponds to a virtual block and said physical block does not have a free page, such that if a write request is received for said virtual block, a new physical block is allocated for said virtual block and data from said write request is written into a first page of said new physical block.

8. The system of claim 7, wherein at a certain time, a group of physical blocks corresponding to a virtual block is compacted by copying at least a portion of data corresponding to virtual pages of said virtual block to a single block if necessary, thereby freeing at least one physical block.

9. The system of claim 8, wherein said single block is a newly allocated block or a most recently allocated block of said virtual block.

10. The system of claim 9, wherein said blocks are compacted when a new physical block is required by said flash management system and a number of free blocks is below a preset number.

11. The system of claim 9, wherein said blocks are compacted when a size of said group of physical blocks corresponding to said virtual block would become larger than a preset number if not compacted.

12. The system of claim 11, wherein said preset number is one, such that said virtual blocks are mapped one-to-one to said physical blocks.

13. The system of claim 1, wherein said flash management system contains a plurality of virtual addresses and wherein said flash device contains a plurality of physical addresses, such that said flash management system maps said virtual addresses to said physical addresses by mapping each virtual page into one or more physical pages.

14. The system of claim 13, wherein each page write request is to a virtual address and wherein said flash management system maps virtual address to a physical address, such that pages are written to a next higher physical address for each subsequent page write operation within at least a portion of said flash device.

15. The system of claim 14, wherein each physically written page is accompanied by a corresponding virtual page number.

16. The system of claim 15 wherein said virtual page number identifies most recently written data corresponding to a requested virtual page when reading data from the flash memory system.

17. The system of claim 16, wherein if a plurality of physical pages are associated with an identical virtual page number, said physical page corresponding to said requested virtual page is said physical page to which data has been most recently written.

18. The system of claim 14, wherein if at least a portion of said flash device does not have a free page to write, and another write request is received for said portion, an additional portion of said flash device is allocated for increasing a size of said portion, and data from said write request is written into a first page of said additional portion.

19. The system of claim 18, wherein at a certain time, said portion of said flash device is compacted by copying data corresponding to at least one virtual page into a new location if necessary, thereby freeing at least one physical page.

20. The system of claim 19, wherein said portion of said flash device is compacted when a new physical page is required by said flash management system and a number of free pages is below a preset number.

21. The system of claim 19, wherein said portion of said flash device is compacted when a size of said portion would become larger than a preset number if not compacted.

22. A method for performing write operations to a flash device which allows only sequential write operations within a block, regardless of an order of receiving write requests for performing said write operations, the method comprising:
receiving a write request from outside the flash device to write data of a predetermined fixed length to a portion of the flash device, said portion containing a plurality of addresses;
locating an address in said portion to write said data from said write request and associated control data according to a previously written address within said portion, such that said address is physically sequential to said previously written address; and
writing said data from said write request and said control data to said portion.

23. The method of claim 22, wherein said previously written address is at a previously written page in a block, Such that if an additional page is available in said block, said data from said write request is written to said additional page, wherein said additional page is at a higher physical address to said previously written page.

24. The method of claim 23, wherein a plurality of write requests is received and wherein said page is located in said block for each write request such that said data from said each write request is written for said each write request to a page at a higher physical address.

25. The method of claim 24, wherein each physical address corresponds to a physical page in a physical block, and wherein said write request is to write data to at least one of a plurality of virtual addresses, each virtual address corresponding to a virtual page in a virtual block, wherein said virtual addresses are mapped to said physical addresses.

26. The method of claim 25, wherein said virtual addresses are mapped to said physical addresses by mapping each virtual block into at least one physical block.

27. The method of claim 26, wherein said plurality of write requests for a plurality of virtual addresses is received in a random order, and wherein data for plurality of write requests is written sequentially by writing each newly written page into a first free physical page of a physical block into which said virtual address to be written is mapped.

28. The method of claim 27, wherein said control data that is written to each physically written page includes a corresponding virtual page number within said virtual block of said virtual page.

29. The method of claim 28, wherein said virtual page number identifies most recently written data corresponding to a requested virtual page for reading data from the flash device.

30. The method of claim 29, wherein if a physical of physical pages have an identical virtual page number, said physical page to be read is said physical page containing the most recently written data.

31. The method of claim 27, wherein if a physical block does not have an available physical page for writing, and a write request is received for a virtual block corresponding to said physical block, a new physical block is allocated for said virtual block and data from said write request is written into a first physical page of said new physical block.

32. The method of claim 31, further comprising:
copying at least one physical page into a new physical location if necessary to free at least one physical block.

33. The method of claim 32, wherein said new physical location is in a newly allocated physical block or a most recently allocated block of said virtual block.

34. The method of claim 32, wherein said at least one physical page is copied when a new physical block is required and a number of free physical blocks is below some preset number.

35. The method of claim 32, wherein said at least one physical page is copied when a size of the group of physical blocks corresponding to a virtual block would become larger than a preset number if not compacted.

36. The method of claim 35, wherein said preset number is one, such that said group of physical blocks contains only one block, such that said virtual blocks map to said physical blocks according to one-la-one mapping.

37. The method of claim 25, wherein said virtual addresses are mapped to said physical addresses by mapping each virtual page into one or more physical pages.

38. The method of claim 37, wherein said plurality of write requests for a plurality of virtual addresses is received in a random order, and wherein data for said plurality of write requests is written sequentially by writing each newly written page into a next free physical page within at least a portion of said physical addresses, regardless of a virtual address to be written.

39. The method of claim 38, wherein said at least a portion of said physical addresses includes at least two non-contiguous physical addresses.

40. The method of claim 38, in which each physically written page is accompanied by a corresponding virtual page number.

41. The method of claim 40, wherein said virtual page number identifies most recently written data corresponding to a requested virtual page.

42. The method of claim 41, wherein if two physical pages have an identical virtual page number, said physical page corresponding to said requested virtual page is said physical page to which data has been most recently written.

43. The method of claim 38, wherein said at least a portion of said physical addresses does not have an available page for writing data from a write request, such that a new portion is allocated for being added to said portion, wherein said data is written to a first page of said new portion.

44. The method of claim 43, further comprising:
copying at least one physical page into a new physical location if necessary to free at least one physical page.

45. The method of claim 44, wherein said new physical location is in a newly allocated physical block or in a block already contained in said portion.

46. The method of claim 45, wherein said at least one physical page is copied when a new physical page is required and a number of free physical pages is below some preset number.

47. The method of claim 45, wherein said at least one physical page is copied when a size of said portion would become larger than a preset number if not compacted.

48. The method of claim 22, wherein data from at least one write request is written without copying previously written data in order to maintain a sequential order of said physical locations of written data.

49. The method of claim 22, wherein, in said writing of said data from said write request and said control data to said portion, copying previously written pages to a new location is optional.

50. A system comprising:
   (a) a flash memory system comprising at least one flash device, said flash device featuring memory comprising a plurality of blocks, each block comprising a plurality of pages;
   (b) a flash management system for managing page write requests from outside of said flash memory system and said flash management system regardless of an order in which said page write requests are received; and
   (c) a module for converting said order of receiving said page write requests into a writing order, such that data in said page write requests along with associated control data are written as physically sequential pages within each block, regardless of said order of receiving said page write requests, and such that, in fulfilling each said page write request, previously written pages of a block are copied to a new location only if said block, in which said previously written pages are written, and in which said data in said each page write request would otherwise be written, lacks a page available for writing.

51. The method of claim 22, wherein, in said writing of said data from said write request to said portion, no previously written pages are copied to a new location.

52. A method for performing write operations to a flash device which allows only sequential write operations within a block, regardless of an order of receiving write requests for performing said write operations, the method comprising:
   receiving a write request from outside the flash device to write data of a predetermined fixed length to a portion of the flash device, said portion containing a plurality of addresses;
   seeking an address in said portion to write said data from said write request and associated control data according to a previously written address within said portion, such that said address is physically sequential to said previously written address; and
   if said address is found: writing said data from said write request and said control data to said portion;
   otherwise: writing said data from said write request and said control data to a different portion of the flash device.

53. The method of claim 52, wherein previously written pages are copied to a new location only if said data from said write request and said control data are written to said different portion of the flash device.

* * * * *

UNITED STATES PATENT AND TRADEMARK OFFICE
CERTIFICATE OF CORRECTION

PATENT NO.    : 6,678,785 B2
DATED         : January 13, 2004
INVENTOR(S)   : Lasser It is certified that error appears in the above-identified patent and that said Letters Patent is hereby corrected as shown below:

<u>Column 7,</u>
Line 64, the word -- along -- was printed as "alone"

Signed and Sealed this

Thirteenth Day of April, 2004

JON W. DUDAS
*Acting Director of the United States Patent and Trademark Office*